United States Patent [19]

Finke et al.

[11] Patent Number: 4,545,553
[45] Date of Patent: Oct. 8, 1985

[54] PIEZOELECTRIC DEICING DEVICE

[75] Inventors: Robert C. Finke, Westlake; Bruce A. Banks, Olmsted Township, Cuyahoga County, both of Ohio

[73] Assignee: The United States of America as represented by the United States National Aeronautics and Space Administration, Washington, D.C.

[21] Appl. No.: 638,541

[22] Filed: Aug. 7, 1984

Related U.S. Application Data

[63] Continuation of Ser. No. 469,867, Feb. 25, 1983, abandoned.

[51] Int. Cl.⁴ .............................................. B64D 15/18
[52] U.S. Cl. ................................. 244/134 D; 29/25.35; 310/324
[58] Field of Search .......... 244/134 R, 134 A, 134 D, 244/134 C; 310/324, 328, 340, 800; 114/22 L; 60/39.093; 29/25.35; 134/1, 17; 252/62.9; 367/157; 427/100; 428/422

[56] References Cited

U.S. PATENT DOCUMENTS

| | | | |
|---|---|---|---|
| 2,769,930 | 11/1956 | Sturm | 29/25.35 |
| 3,519,229 | 7/1970 | Son Gullberg | 244/134 R |
| 3,809,341 | 5/1974 | Levin et al. | 244/134 R |
| 3,943,614 | 3/1976 | Yoshikawa et al. | 29/25.35 |
| 4,283,461 | 8/1981 | Wooden et al. | 428/422 |
| 4,297,394 | 10/1981 | Wooden et al. | 427/100 |
| 4,385,255 | 5/1983 | Yamaguchi et al. | 29/25.35 |

FOREIGN PATENT DOCUMENTS

| | | | |
|---|---|---|---|
| 505433 | 5/1939 | United Kingdom | 244/134 A |
| 2106966 | 4/1983 | United Kingdom | 244/134 D |

OTHER PUBLICATIONS

Bloomfield et al., "Piezo- and Pyroelectricity in Poly (Vinylidene Fluoride)", NAV Res. Rev., vol. 31, No. 5, May 1978.

Primary Examiner—Galen L. Barefoot
Attorney, Agent, or Firm—Gene E. Shook; John R. Manning

[57] ABSTRACT

A fast voltage pulse is applied to a transducer which comprises a composite of multiple layers of alternately polarized piezoelectric material. These layers are bonded together and positioned over the curved leading edge of an aircraft wing structure. Each layer is relatively thin and metallized on both sides. The strain produced in the transducer causes the composite to push forward resulting in detachment and breakup of ice on the leading edge of the aircraft wing.

3 Claims, 4 Drawing Figures

PIEZOELECTRIC DEICING DEVICE

ORIGIN OF THE INVENTION

The invention described herein was made by employees of the U.S. Government and may be manufactured and used by or for the Government for governmental purposes without the payment of any royalties thereon or therefor.

This is a continuation of application Ser. No. 469,867, filed Feb. 25, 1983, now abandoned.

TECHNICAL FIELD

This invention is directed to the removal of ice from the leading edge of aircraft wings. This invention provides a reliable, durable, low power electrical means for removing this ice.

Ice has been removed and its formation prevented by relying on bleed air heating. Also, inflatable leading edge boots have been used. It has been proposed to apply electromagnetic pulses to the leading edge skin, and the application of acoustic vibrations of piezoelectric materials has been suggested. Another widely accepted method is coating the surface with ethylene glycol.

All of these methods have disadvantages. More particularly, bleed air heating consumes considerable amounts of power. The inflatable leading edge boots may not remove ice if a pocket or gap develops in front of the boot. The passage of electromagnetic pulses through the leading edge skin may cause fatigue of the wing skin, and piezoelectric acoustic vibrations may cause wing skin or structural fatigue. The weight associated with the feed system for ethylene glycol surface coating may be considerable.

BACKGROUND ART

Levin et al U.S. Pat. No. 3,809,341 discloses a broad concept for removing ice from the leading edge of an airplane wing by applying electrical pulses to a transducer. This converts the electrical pulses to mechanical power pulses which act on the surface to be deiced.

Wooden et al U.S. Pat. Nos. 4,283,461 and 4,297,394 disclose the use of a multilayer piezoelectric transducer which vibrates in response to the application of an alternating current. This vibration prevents the attachment of vegetable and animal life to a ship's plate.

DISCLOSURE OF INVENTION

In accordance with the present invention, ice is removed from the leading edge of an aircraft wing by applying a fast voltage pulse to a multilayer piezoelectric transducer positioned over the curved leading edge of the aircraft wing structure. The piezoelectric transducer comprises multiple layers of alternately polarized piezoelectric layers. Each layer is relatively thin and metallized on both sides, and a thick protective cover polymer is applied to the transducer.

By using a plurality of thin layers of piezoelectric material, low voltages can be employed to develop high bulk forces. The strain produced in the transducer causes the composite to push forward resulting in detachment and breakup of ice on the leading edge of the aircraft wing.

BRIEF DESCRIPTION OF THE DRAWING

The details of the invention will be more fully described when taken with the accompanying drawing in which.

BEST MODE FOR CARRYING OUT THE INVENTION

Piezoelectric materials can be manufactured by solidifying piezoelectrically polar substances in the presence of an applied electric field to align the polar structure. This ability to manufacture piezoelectric materials facilitates the fabrication of deicing devices using piezoelectric composite materials made in accordance with the present invention.

Figure 1:
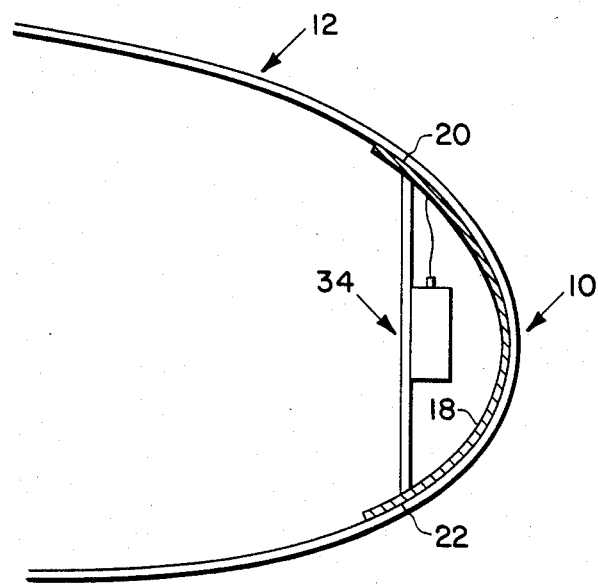
FIG. 1 is a vertical section view through the wing of an aircraft.

Referring now to FIG. 1, there is shown an improved deicing device 10 constructed in accordance with the present invention. The deicing device 10 is mounted on the curved leading edge of an aircraft wing 12.

Figure 2:
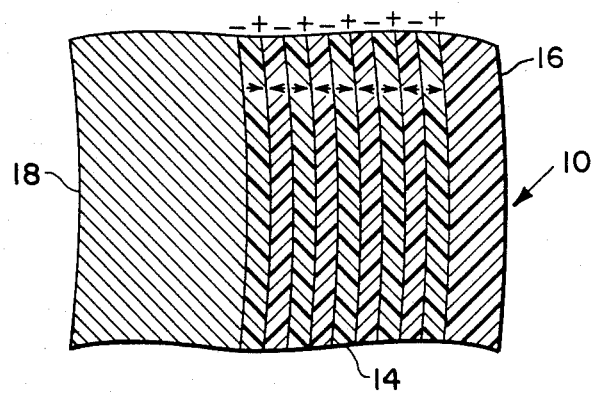
FIG. 2 is an enlarged section view of a portion of the structure shown in FIG. 1.

As shown in FIG. 2, the deicing device 10 comprises a composite formed of multiple layers or sheets 14 of alternating direction polarized piezoelectric materials as indicated by the signs and arrows. A polymer material exhibiting the aforesaid piezoelectric properties is satisfactory for the sheets 14. Polyvinylidene fluoride ($PVF_2$) is a satisfactory material for the sheets 14 in the deicing device 10.

The sheets 14 are preferably very thin, having thicknesses between about 0.003 inch to 0.010 inch. The sheets 14 are metallized on both surfaces as will be explained later in greater detail in the description of FIG. 3.

These individual sheets 14 are bonded to each other to form a multilayer piezoelectric transducer. Reference is made to copending patent application Ser. No. 397,281 entitled "Piezoelectric Composite Materials" which was filed on July 12, 1982 and issued as U.S. Pat. No. 4,400,642 on Aug. 23, 1983.

The number and thicknesses of the sheets 14 in the transducer can be varied. It is further contemplated that the multilayer composite transducer may be formed by rolling a single sheet of a polymer material, such as $PVF_2$, and then flattening it.

An important feature of the invention is that the multilayer piezoelectric transducer moves as a single thick sheet. This thick transducer is bonded to a thick protective cover 16 of a polymer material. The polymer cover 16 protects the thin sheets 14 from particle damage. The polymer material of the cover 16 should be resistant to abrasion, weather, high impact, and ultraviolet light.

The piezoelectric deicing device 10 is positioned over the curved leading edge of the aircraft wing skin 18 as shown in FIG. 1. The aircraft skin structure 18 is relied on to retain the gross shape of the curved leading edge.

The deicing device 10 is rigidly attached to the wing skin 18 at the trailing top edge 20 of the device 10 and its bottom edge 22. The composite forming the deicing device may or may not be loosely bonded to the skin 18 with low modulus polymeric interfacial materials under the PVF$_2$.

It is apparent that by using many thin layers or sheets 14 of the polymer material rather than one thick layer, low voltages may be used to cause high bulk forces to develop. Thus, the deicing device is lighter in weight and lower in power requirements than prior art devices.

Figure 3:
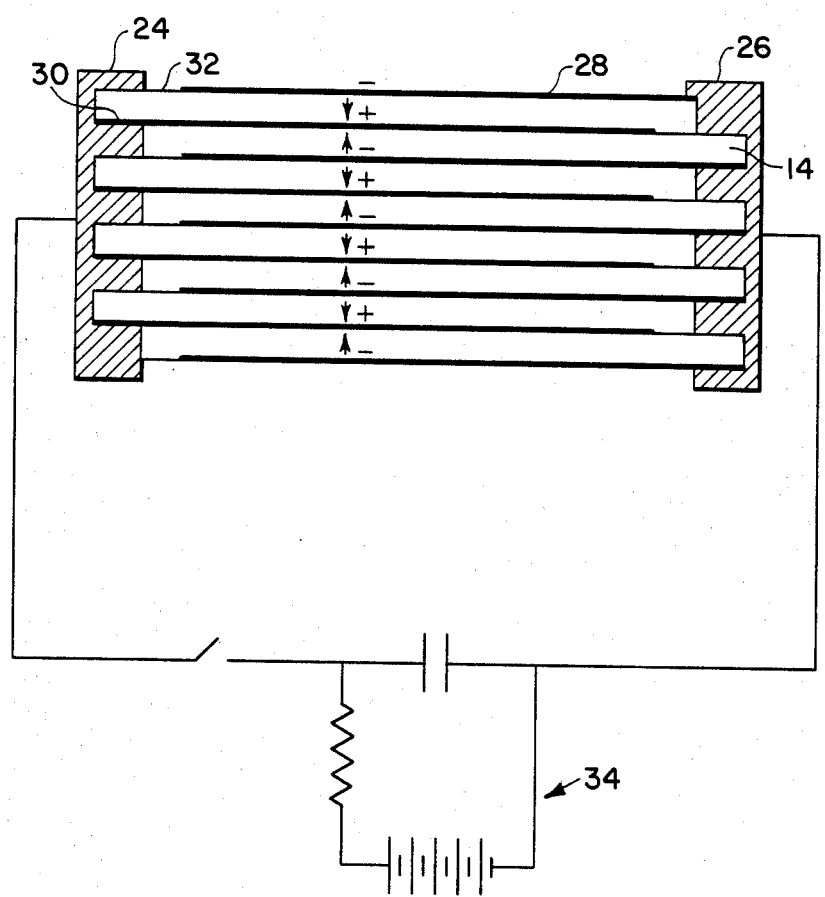
FIG. 3 is a simplified schematic view of a piezoelectric device constructed in accordance with the invention.

Referring now to the simplified schematic view of the piezoelectric deicing device constructed in accordance with present invention shown in FIG. 3, the polymer sheets 14 are mounted between two metallized terminals 24 and 26. Each sheet 14 has its direction of polarization opposite to that of the contiguous sheets above and below it. The arrows shown in FIG. 3 indicate the direction of polarization.

Each sheet 14 is metallized with aluminum or some other electrically conductive metal to form a first layer 28 on one surface and another layer 30 on the opposite surface. The first layer 28 is in electrical contact with a terminal 24 or 26. The layer 30 on the opposite surface is in electrical contact with the other terminal.

Figure 4:
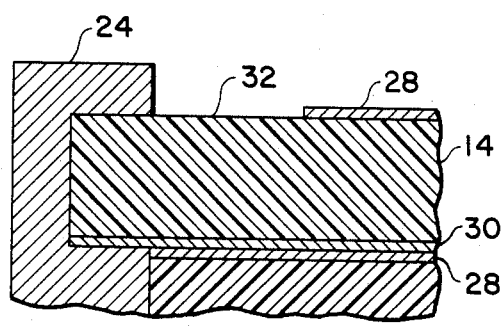
FIG. 4 is an enlarged sectional view of a portion of the device shown in FIG. 3.

Each metallized sheet 14 is adhesively bonded to the adjacent sheets thereby producing a laminar composite structure. As shown in FIGS. 3 and 4 the metallization does not cover a portion 32 of each surface of each sheet 14 adjacent to a terminal edge. This enables the proper voltage to be applied to the opposite surfaces of the sheets 14.

As shown in FIG. 3 the polarity of the voltage similarly alternates from sheet to sheet just as the direction of polarization does. This causes the piezoelectric strain to be the same sign (expansive or contractible) for all the sheets 14 resulting in all sheets moving in unison.

In operation, a fast voltage pulse from a suitable power supply 34 is applied to the terminals 24 and 26. This pulse places a positive electrical charge on one terminal and a negative charge on the other teriminal. These charges are transmitted to the metallized surface layers 28 and 30 which contact that particular terminal. Each pulse produces polarization in the direction of the arrows shown in FIG. 3.

This pulse results in a sheet lengthening piezoelectric strain. The high g strain causes the bulk transducer composite to push forward away from the skin 18, rapidly causing detachment and breakup of the leading edge ice. This occurs because the ends of the composite sheets are attached to the aircraft wing skin 18 at the edges 20 and 22. However, the major portion of the composite 10 is not bonded to the aircraft skin; thus it is free to move forward.

It will be appreciated that the pulse amplitude from the power supply 34 may be varied. Also, the repetition rate may be likewise varied.

While the preferred embodiment of the invention has been disclosed and described, various structural modifications may be made without departing from the spirit of the invention or the scope of the subjoined claims.

We claim:

1. Apparatus for removing ice from an aircraft wing comprising
   a transducer for covering the leading edge of said aircraft wing, said transducer comprising
      multiple sheets of alternately polarized piezoelectric polymeric material bonded together to form a composite, each of said sheets being metallized on both surfaces, and
      a pair of spaced metallized terminals, one of said terminals being in electrical contact with one of said metallized surfaces of each of said sheets and the other of said terminals being in electrical contact with the other of said metallized surfaces on each of said sheets,
   means for restraining oppositely disposed edges of said composite from movement while providing freedom of movement of the central portion thereof,
   a direct current electrical power supply,
   means for selectively connecting said electrical power supply to said spaced terminals for applying a fast voltage pulse thereto so that a positive electrical charge is placed on said one of said terminals and a negative electrical charge is placed on said other of said terminals thereby producing a sheet lengthening piezoelectric strain in said sheets to cause the unrestrained central portion of said composite to move forward away from said aircraft wing so long as said fast voltage pulse is maintained, and
   a cover of a polymeric material bonded to said composite for protecting the exposed surface thereof from particle damage.

2. Apparatus for removing ice from an aircraft wing as claimed in claim 1 wherein said sheets have thicknesses between about 0.003 inch and about 0.010 inch.

3. Apparatus for removing ice from an aircraft wing as claimed in claim 1 wherein said polymeric material comprises polyvinylidene fluoride.

* * * * *